(12) United States Patent  
Carpenter et al.

(10) Patent No.: US 8,754,521 B1
(45) Date of Patent: Jun. 17, 2014

(54) SEMICONDUCTOR DEVICE ASSEMBLY HAVING A HEAT SPREADER

(71) Applicants: Burton J. Carpenter, Austin, TX (US); Leo M. Higgins, III, Austin, TX (US); Yuan Yuan, Austin, TX (US)

(72) Inventors: Burton J. Carpenter, Austin, TX (US); Leo M. Higgins, III, Austin, TX (US); Yuan Yuan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/799,031

(22) Filed: Mar. 13, 2013

(51) Int. Cl.
*H01L 23/34* (2006.01)
*H01L 21/56* (2006.01)

(52) U.S. Cl.
USPC ........... 257/706; 257/712; 257/713; 257/730; 257/796; 438/106; 438/112; 438/122; 438/124; 438/127

(58) Field of Classification Search
CPC ... H01L 21/50; H01L 21/563; H01L 21/4871; H01L 23/28; H01L 23/31; H01L 23/315; H01L 23/3157; H01L 23/34; H01L 23/36; H01L 23/3672; H01L 23/3736

USPC .......... 257/706, 712, 713, 730, 796; 438/106, 438/112, 122, 124, 127
See application file for complete search history.

(56) References Cited

U.S. PATENT DOCUMENTS

| | | | | |
|---|---|---|---|---|
| 5,175,612 A | * | 12/1992 | Long et al. | 257/667 |
| 5,982,621 A | * | 11/1999 | Li | 361/704 |
| 6,146,921 A | | 11/2000 | Barrow | |
| 6,507,116 B1 | | 1/2003 | Caletka et al. | |
| 6,534,859 B1 | * | 3/2003 | Shim et al. | 257/706 |
| 6,998,707 B2 | * | 2/2006 | Fukuda et al. | 257/713 |
| 7,859,101 B2 | | 12/2010 | Shao et al. | |

* cited by examiner

*Primary Examiner* — Peniel M Gumedzoe
(74) *Attorney, Agent, or Firm* — Mary Jo Bertani; Joanna G. Chiu

(57) ABSTRACT

A packaged semiconductor device includes a package substrate, a semiconductor die on the package substrate, an encapsulant over the semiconductor die and package substrate, and a heat spreader having a pedestal portion and an outer portion surrounding the pedestal portion. The encapsulant includes an opening within a perimeter of the semiconductor die. The bottom surface of the pedestal portion of the heat spreader faces the top surface of the semiconductor die, wherein a first portion of the opening and at least a portion of the encapsulant is between the bottom surface of the pedestal portion and the semiconductor die.

17 Claims, 3 Drawing Sheets

SEMICONDUCTOR DEVICE ASSEMBLY HAVING A HEAT SPREADER

BACKGROUND

1. Field

This disclosure relates generally to semiconductor device packaging, and more specifically, to a semiconductor device assembly having a heat spreader.

2. Related Art

Heat is generated by an integrated circuit (IC) die during operation. If inadequately removed, the heat generated by the die may cause the device to fail or to perform erratically. As such, heat spreaders are often incorporated into semiconductor packages to improve the thermal performance of the IC.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Heat spreaders are often used in semiconductor device assemblies to improve thermal performance. In one such known device assembly, a thermal interface material is applied to the surface of the die and an adhesive material is applied to the surface of the mold compound or encapsulant surrounding a peripheral portion of the die. Subsequent to the application of the thermal interface material and the adhesive material, the heat sink is attached to the surface of the die and adhesively bonded to the mold compound. However, this type of device assembly requires careful process control to achieve the desired interface between the heat sink and the die as well as the heat sink and the mold compound. Therefore, in one embodiment, as will be described below in reference to FIGS. 1-4, extensions are formed in the mold compound over the upper surface of the die to control the distance between the heat spreader and the die. In this manner, the die is protected from direct contact with the heat sink and the desired distance between the heat sink pedestal and the die is achieved.

Figure 1:
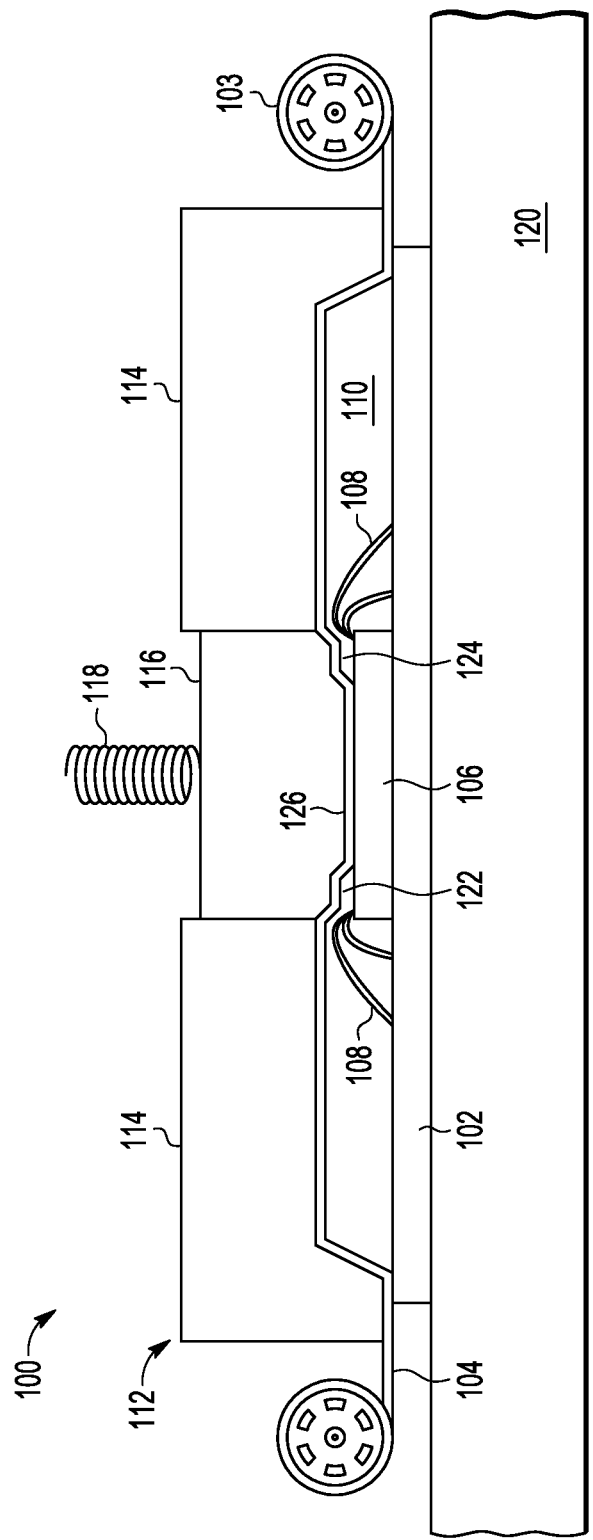
FIG. 1 illustrates a cross sectional view of a semiconductor device assembly at a stage in processing, in accordance with one embodiment of the present disclosure.

FIG. 1 illustrates a semiconductor device assembly 100 at a stage in processing in accordance with one embodiment. Semiconductor device assembly 100 includes a semiconductor die assembly (also referred to as an integrated circuit (IC) die assembly) that includes substrate 102, die 106, electrical connections 108, and mold compound 110. Semiconductor die 106 is attached to package substrate 102 by way of die attach (not shown), and electrical connections 108 which route electrical signals between die 106 and package substrate 102. In one embodiment, electrical connections 108 are implemented as wire bonds. Semiconductor die assembly also includes a mold compound 110 (also referred to as an encapsulant) surrounding a peripheral portion of die 106. Mold compound 110 is formed by outer portion 114 of upper mold tool 112 to cover electrical connections 108 and to extend from the peripheral portion of die 106 over a surface of package substrate 102. Mold compound 110 is also formed by an inner portion 116 of upper mold tool 112 so as to expose a top major surface of die 106, with extensions 122, 124 over a portion of die 106.

Substrate 102 can be a package substrate, a leadframe, or other suitable surface for mounting die 106.

In one embodiment, film assisted molding may be used to form mold compound 110 during which a thin film of material 104 extends between reels 103 and is held by suction to a contact surface of upper mold tool 112 during the molding process. Alternatively, the semiconductor die assembly may be a flip chip assembly in which die 106 is attached to package substrate 102 by way of solder balls, where the solder balls provide the electrical connections to communicate signals between die 106 and substrate 102.

Inner portion 116 of upper mold tool 112 can be configured with a spring 118 to allow inner portion 116 to be brought into contact with the surface of die 106. A bottom portion 126 of inner portion 116 is shaped to form extensions 122, 124 of mold compound over one or more portions of die 106 and to remove mold compound from other areas over die 106. Alternatively, inner portion 116 can be moved under pneumatic or hydraulic pressure, or fixed in position (unmovable).

Figure 2:
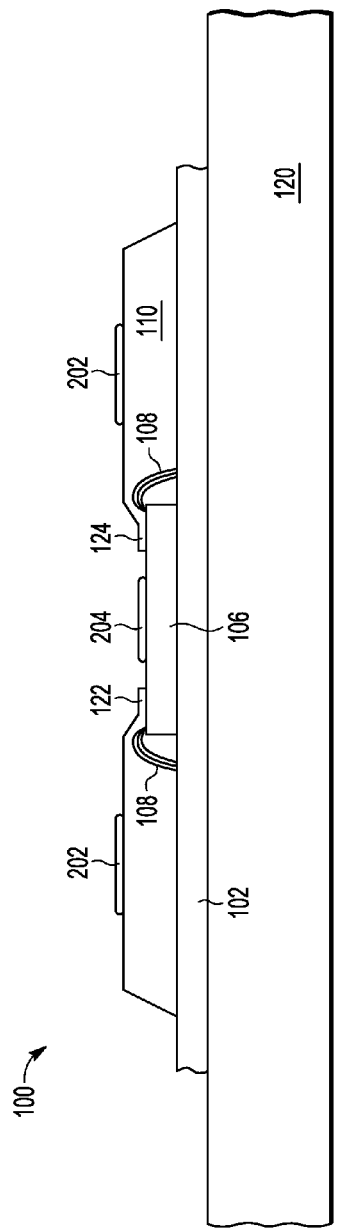
FIG. 2 illustrates a cross sectional view of the semiconductor device assembly of FIG. 1 at a subsequent stage in processing, in accordance with one embodiment of the present disclosure.

FIG. 2 illustrates a cross sectional view of the semiconductor device assembly of FIG. 1 at a subsequent stage in processing, in accordance with one embodiment of the present disclosure in which an interface material 204 is applied to the exposed top surface of die 106 of die assembly and adhesive 202 is applied to the top surface of sections of mold compound 110. Interface material 204 may be a thermal interface material (TIM). Interface material 204 may also be an adhesive material. Materials 202 and 204 can be the same or different materials.

Adhesive 202 is a substance that may include, for example, die attach adhesives, or underfill materials used for flip chip assemblies or surface mount assemblies of ball grid arrays. In one embodiment, adhesive 202 may have thermally enhanced properties. Interface material 204 is a different material than adhesive 202. Therefore, interface material 204 may have different thermal properties and/or different mechanical properties than adhesive 202. While both may have desirable adhesive properties and/or thermal properties, the thermal properties are more important than the adhesive properties for interface material 204, and the adhesive properties are more important than the thermal properties for adhesive 202. That is, the primary function of interface material 204 is to conduct heat while the primary function of adhesive 202 is to ensure that heat spreader 202 is reliably attached to die assembly.

Figure 3:
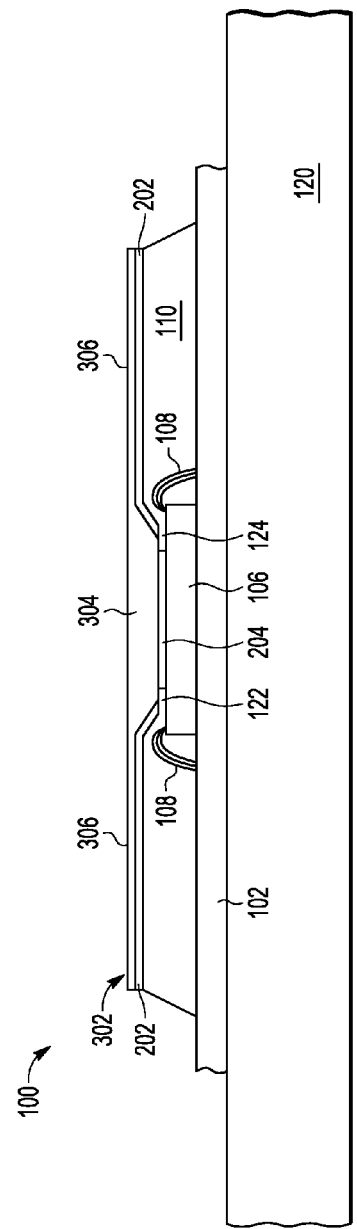
FIG. 3 illustrates a cross sectional view of the semiconductor device assembly of FIG. 2 at a subsequent stage in processing, in accordance with one embodiment of the present disclosure.

FIG. 3 illustrates device assembly 100 after heat spreader 302 is mounted onto the die assembly. Heat spreader 302 includes a pedestal portion 304 which will contact the exposed top surface of die 106 by way of interface material 204, and a periphery portion 306 which extends from pedestal portion 304 to cover at least a portion of mold compound 110.

Pedestal portion 304 is positioned so as to contact interface material 204 such that the pedestal portion 304 of heat spreader 302 is separated from the exposed portion of die 106 by extensions 122, 124. A gap between die 106 and a bottom or facing surface of pedestal portion 304 is at least partially filled with interface material 204. Also, note that pedestal 304 is positioned inside a perimeter of die 106 including the wire bonds (electrical connections 108). Pressure may be applied to heat spreader 202 and/or die assembly to bring heat spreader 302 in contact with extensions 122, 124 so as to establish a target, or predetermined, gap distance between the top surface of die 106 and a bottom surface of pedestal portion 304 of heat spreader 302. In one embodiment, this gap distance can be less than 80 micrometers. Therefore, note that interface material 204 spreads within the gap and may also cover portions of extensions 122, 124. Since interface material 204 is between pedestal portion 304 and die 106, the target gap distance also corresponds to the target, or predetermined, thickness of extensions 122, 124 to achieve a desired thickness of interface material 204 between heat spreader 302 and die assembly. A thickness of the encapsulant 110 between the bottom surface of the pedestal portion 304 and the semiconductor die 106 is less than a thickness of the encapsulant 110 outside a perimeter of the bottom surface of the pedestal portion 304.

The amount of interface material 204 placed onto device assembly is controlled so that, upon bringing heat spreader 302 into contact with interface material 204, interface material 204 typically does not extend beyond die 106. After application of adhesive 202, completed device assembly 100 may be cured. In one embodiment, curing may be optimized for one of adhesive 202 or interface material 204.

In the embodiment shown, heat spreader 302 comprises an outer portion 306 surrounding the pedestal portion 304. The thickness of outer portion 306 is less than the thickness of pedestal portion 304. The bottom surface of the pedestal portion 304 is at a different elevation above a bottom surface of the outer portion 306 to reach extensions 122, 124. In another embodiment, heat spreader 302 may be of constant thickness, whereby the center portion is downset relative to outer portion 306 such that the inner portion contacts interface material 204 over die 106, and the outer portion 306 contacts adhesive material 202 over mold compound 110.

Figure 4:
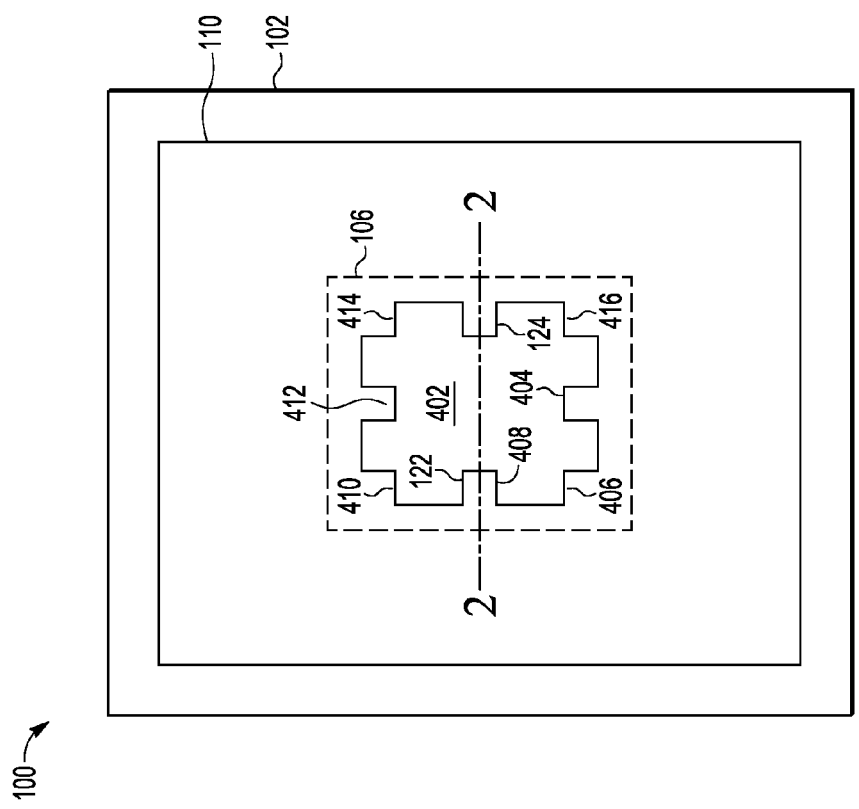
FIG. 4 illustrates a top down view of the semiconductor device of FIG. 2 in accordance with one embodiment of the present disclosure.

FIG. 4 illustrates a top view of the semiconductor device 100 of FIG. 2 in accordance with one embodiment of the present disclosure. An opening 402 in mold compound 110 includes tabs, protrusions, or extensions 122, 124, 404-416 over the top surface of die 106. Extensions 122, 124, 404-416 are shown as tabs but can be configured in other suitable shapes. For example, extensions can be continuous segments of mold compound across the surface of die 106 while leaving some area(s) of die exposed or in contact with a heat spreader through interface material for heat dissipation. One or more openings 402 can be included in the configuration of the extensions. Extensions 122, 124, 404-416 control the distance between heat spreader 302 (FIG. 3) and exposed portions of die 106 when heat spreader 302 is mounted on semiconductor device 100.

Therefore, by now it should be appreciated that in some embodiments, there has been provided a packaged semiconductor device that can include a package substrate, a semiconductor die on the package substrate, and an encapsulant over the semiconductor die and package substrate. The encapsulant comprises an opening within a perimeter of the semiconductor die. A heat spreader having a pedestal portion and an outer portion surrounds the pedestal portion. A bottom surface of the pedestal portion faces the top surface of the semiconductor die. A first portion of the opening and at least a portion of the encapsulant is between the bottom surface of the pedestal portion and the semiconductor die.

In another aspect, a second portion of the opening is between a perimeter of the bottom surface of the pedestal portion and the perimeter of the semiconductor die.

In another aspect, a thickness of the encapsulant between the bottom surface of the pedestal and the semiconductor die is less than a thickness of the encapsulant outside a perimeter of the bottom surface of the pedestal portion and inside a perimeter of the semiconductor die.

In another aspect, the device can further comprise an interface material within the opening.

In another aspect, the encapsulant can comprise a plurality of openings within the perimeter of the semiconductor die. Each opening of the plurality of openings comprises a first portion between the bottom surface of the pedestal portion and the semiconductor die and a second portion outside a perimeter of the bottom surface of the pedestal portion and inside the perimeter of the semiconductor die.

In another aspect, the opening can comprise a plurality of protrusions extending from a perimeter of the opening onto a top surface of the semiconductor die. Each of the plurality of protrusions is between the bottom surface of the pedestal portion of the heat spreader and the semiconductor die.

In another aspect, the heat spreader can comprise an outer portion surrounding the pedestal portion, wherein the outer portion is thinner than the pedestal portion.

In another aspect, the heat spreader can comprise an outer portion surrounding the pedestal portion, wherein the bottom surface of the pedestal portion is at a different elevation than a bottom surface of the outer portion.

In another aspect, a shortest distance between the bottom surface of the pedestal portion of the heat spreader and the top surface of the semiconductor die can be less than 80 microns.

In other embodiments, a packaged semiconductor device can comprise a package substrate, a semiconductor die on the package substrate, and an encapsulant over the semiconductor die and package substrate. The encapsulant can comprise an opening having a perimeter located within a perimeter of the semiconductor die, and a plurality of protrusions within the opening which extend from a perimeter of the opening onto a top surface of the semiconductor die. A heat spreader can have a pedestal portion and an outer portion surrounding the pedestal portion. The pedestal portion can be over the semiconductor die. The plurality of protrusions and at least a portion of the opening can be between the pedestal portion and the semiconductor die.

In another aspect, the device can further comprise an interface material within the opening, between the semiconductor die and the pedestal portion of the heat spreader.

In another aspect, a bottom surface of the pedestal portion faces the top surface of the semiconductor die. At least a portion of the perimeter of the opening can be located outside a perimeter of a bottom surface of the pedestal portion of the heat spreader and inside the perimeter of the semiconductor die.

In another aspect, a thickness of the encapsulant between the bottom surface of the pedestal and the semiconductor die can be less than a thickness of the encapsulant outside a perimeter of the bottom surface of the pedestal portion.

In another aspect, a first protrusion of the plurality of protrusions can extend a full width of the opening.

In another aspect, the heat spreader can comprise an outer portion surrounding the pedestal portion. The outer portion can be thinner than the pedestal portion.

In another aspect, the pedestal portion can be downset relative to the outer portion such that the inner portion contacts interface material over the semiconductor die, and the outer portion contacts adhesive material over the encapsulant.

In another aspect, a shortest distance between the bottom surface of the pedestal portion of the heat spreader and the top surface of the semiconductor die can be less than 80 microns.

In still other embodiments, a method for forming a packaged semiconductor device can comprise forming an encapsulant over a semiconductor die and a package substrate. The semiconductor die can be mounted onto the packaged substrate, and the encapsulant can comprise an opening which exposes a top surface of the semiconductor die. An interface material can be applied to the top surface of the semiconductor die within the opening. A pedestal portion of a heat spreader can be positioned to contact the interface material. A first portion of the opening and at least a portion of the encapsulant can be between a bottom surface of the pedestal portion and the semiconductor die.

In another aspect, a thickness of the encapsulant between the bottom surface of the pedestal and the semiconductor die can be less than a thickness of the encapsulant outside a perimeter of the bottom surface of the pedestal portion and inside a perimeter of the semiconductor die.

In another aspect, the opening can comprise a plurality of protrusions extending from a perimeter of the opening onto a top surface of the semiconductor die. Each of the plurality of protrusions is between the bottom surface of the pedestal portion of the heat spreader and the semiconductor die.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device, comprising:
    a package substrate;
    a semiconductor die on the package substrate;
    an encapsulant over the semiconductor die and package substrate, wherein the encapsulant comprises a plurality of openings within a perimeter of the semiconductor die, wherein each opening of the plurality of openings comprises a first portion between the bottom surface of the pedestal portion and the semiconductor die and a second portion outside a perimeter of the bottom surface of the pedestal portion and inside the perimeter of the semiconductor die;
    a heat spreader having a pedestal portion and an outer portion surrounding the pedestal portion, wherein a bottom surface of the pedestal portion faces the top surface of the semiconductor die, wherein a first portion of the opening and at least a portion of the encapsulant is between the bottom surface of the pedestal portion and the semiconductor die.

2. The packaged semiconductor device of claim 1, wherein a thickness of the encapsulant between the bottom surface of the pedestal and the semiconductor die is less than a thickness of the encapsulant outside a perimeter of the bottom surface of the pedestal portion and inside a perimeter of the semiconductor die.

3. The packaged semiconductor device of claim 1, further comprising:
    an interface material within the plurality of openings.

4. The packaged semiconductor device of claim 1, wherein one of the openings comprises a plurality of protrusions extending from a perimeter of the opening onto a top surface of the semiconductor die, wherein each of the plurality of protrusions is between the bottom surface of the pedestal portion of the heat spreader and the semiconductor die.

5. The packaged semiconductor device of claim 1, wherein the heat spreader comprises an outer portion surrounding the pedestal portion, wherein the outer portion is thinner than the pedestal portion.

6. The packaged semiconductor device of claim 1, wherein the heat spreader comprises an outer portion surrounding the pedestal portion, wherein the bottom surface of the pedestal portion is at a different elevation than a bottom surface of the outer portion.

7. The packaged semiconductor device of claim 1, wherein a shortest distance between the bottom surface of the pedestal portion of the heat spreader and the top surface of the semiconductor die is less than 80 microns.

8. A packaged semiconductor device, comprising:
    a package substrate;
    a semiconductor die on the package substrate;
    an encapsulant over the semiconductor die and package substrate, wherein the encapsulant comprises:
        an opening having a perimeter located within a perimeter of the semiconductor die, and
        a plurality of protrusions within the opening which extend from a perimeter of the opening onto a top surface of the semiconductor die; and
    a heat spreader having a pedestal portion and an outer portion surrounding the pedestal portion, wherein the pedestal portion is over the semiconductor die and wherein the plurality of protrusions and at least a portion of the opening are between the pedestal portion and the semiconductor die.

9. The packaged semiconductor device of claim 8, further comprising:
    an interface material within the opening, between the semiconductor die and the pedestal portion of the heat spreader.

10. The packaged semiconductor device of claim 8, wherein a bottom surface of the pedestal portion faces the top surface of the semiconductor die, and wherein at least a portion of the perimeter of the opening is located outside a perimeter of a bottom surface of the pedestal portion of the heat spreader and inside the perimeter of the semiconductor die.

11. The packaged semiconductor device of claim 8, wherein a thickness of the encapsulant between the bottom surface of the pedestal and the semiconductor die is less than a thickness of the encapsulant outside a perimeter of the bottom surface of the pedestal portion.

12. The packaged semiconductor device of claim 8, wherein a first protrusion of the plurality of protrusions extends a full width of the opening.

13. The packaged semiconductor device of claim 8, wherein the heat spreader comprises an outer portion surrounding the pedestal portion, wherein the outer portion is thinner than the pedestal portion.

14. The packaged semiconductor device of claim 8, wherein the pedestal portion is downset relative to the outer portion such that the inner portion contacts interface material over the semiconductor die, and the outer portion contacts adhesive material over the encapsulant.

15. The packaged semiconductor device of claim 8, wherein a shortest distance between the bottom surface of the pedestal portion of the heat spreader and the top surface of the semiconductor die is less than 80 microns.

16. A method for forming a packaged semiconductor device, comprising:

forming an encapsulant over a semiconductor die and a package substrate, wherein the semiconductor die is mounted onto the packaged substrate, and wherein the encapsulant comprises an opening which exposes a top surface of the semiconductor die and the opening comprises a plurality of protrusions extending from a perimeter of the opening onto a top surface of the semiconductor die, wherein each of the plurality of protrusions is between the bottom surface of the pedestal portion of the heat spreader and the semiconductor die;

applying an interface material to the top surface of the semiconductor die within the opening; and positioning a pedestal portion of a heat spreader to contact the interface material, wherein a first portion of the opening and at least a portion of the encapsulant is between a bottom surface of the pedestal portion and the semiconductor die.

17. The method of claim 16, wherein a thickness of the encapsulant between the bottom surface of the pedestal and the semiconductor die is less than a thickness of the encapsulant outside a perimeter of the bottom surface of the pedestal portion and inside a perimeter of the semiconductor die.

* * * * *